(12) United States Patent
Liu et al.

(10) Patent No.: US 12,244,311 B2
(45) Date of Patent: Mar. 4, 2025

(54) POWER LOSS REGULATION CIRCUIT

(71) Applicant: Taiwan Semiconductor Manufacturing Company, Ltd., Hsinchu (TW)

(72) Inventors: Je Syu Liu, New Taipei (TW); Chia-Chen Kuo, Hsinchu (TW); Yangsyu Lin, New Taipei (TW); Cheng Hung Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 108 days.

(21) Appl. No.: 17/587,616

(22) Filed: Jan. 28, 2022

(65) Prior Publication Data
US 2023/0246647 A1 Aug. 3, 2023

(51) Int. Cl.
*H03K 19/0185* (2006.01)
*G11C 5/14* (2006.01)
*H03K 19/20* (2006.01)

(52) U.S. Cl.
CPC .............. *H03K 19/20* (2013.01); *G11C 5/14* (2013.01)

(58) Field of Classification Search
CPC .................................. G11C 5/14; H03K 19/20
See application file for complete search history.

(56) References Cited

U.S. PATENT DOCUMENTS

| | | | |
|---|---|---|---|
| 6,246,265 B1* | 6/2001 | Ogawa ............. | H03K 19/00315 326/113 |
| 6,433,586 B2* | 8/2002 | Ooishi .................... | H03K 3/012 326/113 |
| 6,762,638 B2* | 7/2004 | Correale, Jr. ...... | H03K 3/35625 327/204 |
| 7,123,068 B1* | 10/2006 | Hoover .................. | H03K 3/012 327/202 |
| 9,673,787 B2* | 6/2017 | Cao ........................ | H03K 3/3562 |
| 9,813,047 B2* | 11/2017 | Jayapal .................. | H03K 3/012 |
| 11,606,093 B2* | 3/2023 | Hsu .................... | H03K 3/356113 |
| 2005/0218943 A1* | 10/2005 | Padhye ................. | G06F 1/3203 327/109 |
| 2006/0119991 A1* | 6/2006 | Garg ........................ | G11C 5/14 361/18 |
| 2006/0181322 A1* | 8/2006 | Kim ...................... | H03K 3/3565 327/206 |
| 2012/0033508 A1* | 2/2012 | Adams ..................... | G11C 5/14 365/189.11 |
| 2022/0108989 A1* | 4/2022 | Kang ...................... | G11C 11/412 |

* cited by examiner

*Primary Examiner* — Kurtis R Bahr
(74) *Attorney, Agent, or Firm* — FOLEY & LARDNER LLP

(57) ABSTRACT

In some aspects of the present disclosure, a circuit in a first power domain is disclosed. In some aspects, the circuit in a first power domain includes a first enable-controlled logic gate coupled to a second circuit in a second power domain different from the first power domain. In some aspects, the circuit in a first power domain includes a feedback loop coupled to the first enable-controlled logic gate, the feedback loop including a first inverter and a second enable-controlled logic gate coupled to the first inverter. In some aspects, the circuit in a first power domain includes a second inverter coupled to the feedback loop.

18 Claims, 6 Drawing Sheets

POWER LOSS REGULATION CIRCUIT

BACKGROUND

In a dual rail design, some circuits receive power from a first power source and some other circuits receive power from a second power source independent of the first power source. In some modes, both of the power sources are enabled. In some other modes, only one of the power sources is enabled.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
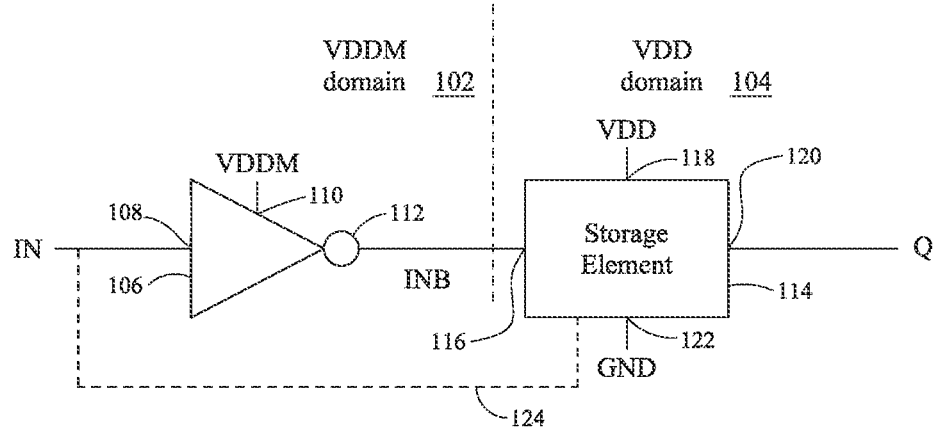
FIG. 1 illustrates a circuit diagram of a dual rail circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a system on a chip (SoC), power rail for memory and logic units can be separated. This can be because memory circuits and logic circuits have different voltage requirements. However, power loss in a first power domain can induce a circuit in the first power domain to generate a floating signal that is sent to the second power domain. A circuit in the second power domain that receives the floating signal can have an unknown signal at the output. In addition, the floating signal can cause DC leakage in the circuit in the second power domain.

The present disclosure provides various embodiments of a circuit, method, and device for isolating other circuits in the second power domain from a floating signal from a circuit in the first power domain. The various embodiments can include a storage element that receives a known signal from the first power domain, stores the known signal, receives a floating signal from the first power domain, and provides a known signal based on the stored signal. The storage element can include a NOR latch that holds the output values even if one of the input values becomes floating. The storage element can include a first tri-state buffer to isolate the two power domains and a second tri-state buffer connected in feedback to keep the signal in the second power domain stable by driving the signal when the first-tri state buffer is disabled.

Advantageously, embodiments of the disclosed memory circuit, method, and device can achieve several benefits. Embodiments of the disclosed memory circuit, method, and device can prevent a leakage path in the second power domain when power is uncontrolled in the first power domain. Embodiments of the disclosed memory circuit, method, and device can have a small area impact.

FIG. 1 illustrates a circuit diagram of a dual rail circuit 100, in accordance with some embodiments of the present disclosure. The dual rail circuit 100 includes a VDDM domain 102. Circuits in the VDDM domain 102 are powered by a rail signal VDDM. A rail can be referred to as voltage rail, power supply, voltage supply, voltage source, power source, and the like. The dual rail circuit includes a VDD domain 104. Circuits in the VDD domain 104 are powered by a rail signal VDD. In some embodiments, memory circuits are in the VDDM domain 102 and logic circuits are in the VDD domain 104, or vice-versa.

In some embodiments, the dual rail circuit 100 includes a logic gate 106 in the VDDM domain 102. In some embodiments, the logic gate 106 includes an input port 108, a voltage supply port such as a VDDM port 110, and an output port 112. The logic gate 106 can receive an input signal IN at the input port 108 and generate an output signal INB at the output port 112. The logic gate 106 can receive the rail signal VDDM at the VDDM port 110.

In some embodiments, the logic gate 106 includes an inverter. The inverter can be implemented as a complementary metal-oxide-semiconductor (CMOS) inverter. The inverter can include an n-type MOS (NMOS) transistor coupled to a p-type MOS (PMOS) transistor. The gates of the NMOS transistor and PMOS transistor can be coupled to the input port 108, the drains of the NMOS transistor and PMOS transistor can be coupled to the output port 112, the source of the PMOS transistor can be coupled to the VDDM port 110, and the source of the NMOS transistor can be coupled to a ground port.

In some embodiments, the dual rail circuit 100 includes a storage element 114 in the VDD domain 104. The storage element 114 can store a signal from the VDDM domain 102. In some embodiments, the storage element 114 includes an input port 116, a voltage supply port such as a VDD port 118, an output port 120, and a ground port such as a GND port 122. The storage element 114 can receive an input signal INB from the VDDM domain 102 at the input port 116 and store the input signal INB. The storage element 114 can output an output signal Q at the output port 120 based on the stored input signal INB. The storage element 114 can receive a rail signal VDD at the VDD port 118 and a ground signal GND at the GND port 122. A rail signal and a ground signal can each be referred to as a reference signal. In some embodiments, the storage element 114 includes one or more additional output ports. An additional output port can provide QB or QBX, which can be inverted from Q. In some embodiments, examples of the storage element 114 include (a) a level-triggered circuit such as a latch, (b) an edge-triggered circuit such as a flip-flop, (c) a register, or (d) a memory circuit. Other examples of the storage element 114 are within the scope of the disclosure.

In some embodiments, the storage element 114 includes an input port 124 in addition to the input port 116. In some embodiments, the input port 108 of the logic gate 106 is coupled to the input port 124. In some embodiments, the logic gate 106 can ensure that at least one of the signals IN or INB is not a floating signal. For example, a magnitude of the signal IN can be equal to a magnitude of the rail signal VDDM. This can be achieved by coupling the input port 108 to the VDDM port 110. By setting a magnitude of the signal IN equal to a magnitude of the rail signal VDDM, the logic gate 106 can ensure that the signal INB at the output port 112 of the logic gate 106 is equal to ground (e.g., zero volts, low, 0V). In some embodiments, this is because the NMOS transistor in the logic gate 106 behaves as a diode-connected transistor so that it is on regardless of whether the signal VDDM has a "VDDM On" voltage (e.g., high, 1.8V, 1.5V, 1.2V, or any suitable voltage level for powering on circuits in the VDDM domain) or is floating or ramping down and has an unknown voltage level. When the NMOS transistor in the logic gate 106 is on, the signal INB can be pulled to the ground.

The dual rail circuit 100 can operate to prevent an output signal in the VDD domain 104 from becoming a floating signal due to the circuits in the VDDM domain 102 losing power. For example, when the dual rail circuit 100 is in a first state, a magnitude of the signal INB is equal to a "VDDM On" voltage. During the first state, the storage element 114 receives and stores the signal INB to generate the stored signal INB'. The rail signal VDDM can ramp down, which can cause the dual rail circuit 100 to be a second state. In the second state, the signal INB can be a floating signal. The storage element 114 uses the stored signal INB' to generate and output the signal Q. Because the stored signal INB' is not floating, the signal Q is not floating. In some embodiments, the storage element inverts the stored signal INB' to generate the signal Q. Using the stored signal INB' instead of the floating signal INB to generate the signal Q can prevent any circuit in the VDD power domain 104, such as the storage element 114, from having a DC leakage path caused by receiving the floating signal INB.

Figure 2:
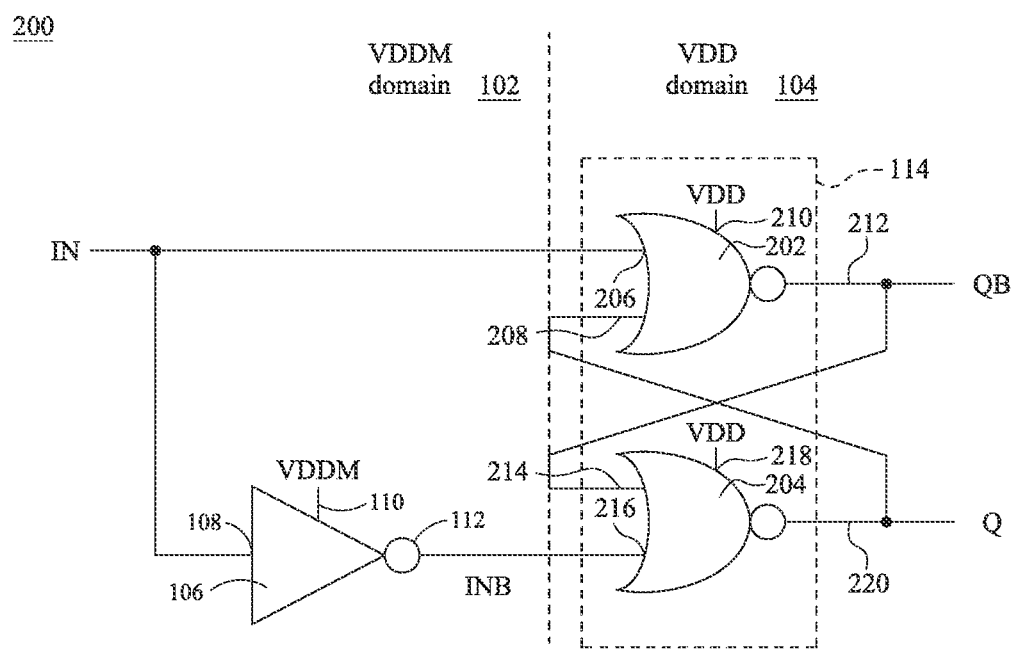
FIG. 2 illustrates a circuit diagram of another dual rail circuit, in accordance with some embodiments of the present disclosure.

FIG. 2 illustrates a circuit diagram of dual rail circuit 200, in accordance with some embodiments of the present disclosure. The dual rail circuit 200 is an instance of the dual rail circuit 100 including an implementation of the storage element 114. In some embodiments, the storage element 114 includes a logic gate 202 and a logic gate 204. In some embodiments, the logic gates 202 and 204 are cross coupled. Cross-coupled logic gates may refer to when a first logic gate has an output connected to an input of the second logic gate and an input connected to an output of the second logic gate.

In some embodiments, the logic gate 202 includes an input port 206, an input port 208, a VDD port 210, and an output port 212. In some embodiments, the input port 206 is coupled to the input port 108 of the logic gate 106. The input port 206 can receive the signal IN from the VDDM domain 102. In some embodiments, the input port 208 is coupled to the output port 220 of the logic gate 204. The output port 212 can provide the signal QB. In some embodiments, the output port 212 is coupled to the input port 214 of the logic gate 204.

In some embodiments, the logic gate 204 includes an input port 214, an input port 216, a VDD port 218, and an output port 220. In some embodiments, the input port 216 is coupled to the output port 112 of the logic gate 106. The input port 216 can receive the signal INB from the VDDM domain 102. The output port 220 can provide the signal Q.

In some embodiments, the logic gate 202 is a first NOR gate and the logic gate 204 is a second NOR gate. In some embodiments, the logic gates 202 and 204 can be referred to as cross-coupled NOR gates or a NOR latch. In some embodiments, each of the logic gates 202 and 204 is a CMOS NOR gate. The CMOS NOR gate can include two PMOS transistors coupled in series and two NMOS transistor coupled in parallel. That is, the drain of the first PMOS transistor can be coupled to the source of the second PMOS transistor and the drain of the second PMOS transistor can be coupled to the drains of both NMOS transistors. The gate of one NMOS transistor and the gate of one PMOS transistor can be coupled to one input port (e.g., the input port 206) and the gate of the other NMOS transistor and the gate of the other PMOS transistor can be coupled to the other input port (e.g., the input port 208). The drain of the NMOS transistor can be coupled to the output port (e.g., the output port 212). The source of the first PMOS transistor can be coupled to a VDD port (e.g., the VDD port 210). The source of the NMOS transistors can be coupled to a ground port.

Figure 3:
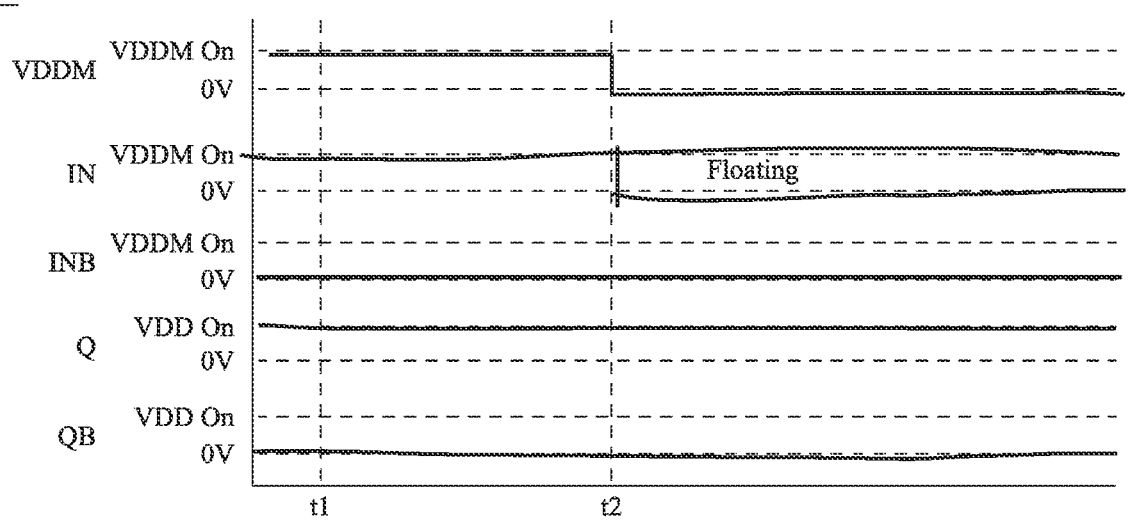
FIG. 3 illustrates a timing diagram for operation of the dual rail circuit of FIG. 2, in accordance with some embodiments of the present disclosure.

FIG. 3 illustrates an exemplary timing diagram for operation 300 of the dual rail circuit 200 of FIG. 2, in accordance with some embodiments of the present disclosure. The exemplary diagram illustrates operation of the dual rail circuit 200 in response to the rail signal VDDM going to 0V (e.g., low). At time t1, a magnitude of the rail signal VDDM at the VDDM port 110 is equal to the "VDDM On" voltage and a magnitude of the signal IN is equal to the "VDDM On" voltage. At time t1, in some embodiments, a magnitude of the signal INB is equal to 0V because the signal IN is inverted by the logic gate 106. At time t1, in some embodiments, a magnitude of the signal QB is equal to 0V because the input port 206 of the logic gate 202 receives the signal INB, which has a magnitude of "VDDM On" volts. At time t1, a magnitude of the signal Q is equal to "VDD On" volts (e.g., high, 1.8V, 1.5V, 1.2V, or any suitable voltage level for powering on circuits in the VDD domain) because the input port 214 of the logic gate 204 is the signal QB, which has a magnitude of 0V, and the input port 216 of the logic gate 204 is the signal INB, which has a magnitude of 0V.

At time t2, a magnitude of the rail signal VDDM goes to 0V. At time t2, a magnitude of the signal IN becomes floating. In some embodiments, a magnitude of the signal IN tracks a magnitude of the rail signal VDDM. At time t2, a magnitude of the signal IN remains at 0V. In some embodiments, this is because the magnitude of the signal IN tracks the magnitude of the rail signal VDDM and both are inputs to the logic gate 106. At time t2, a magnitude of the signal Q remains at "VDD On" because the inputs of the logic gate 204 have not changed. At time t2, a magnitude of the signal QB remains at 0V because the signal Q, which is received at the input port 208 of the logic gate 202, remains at "VDD On," even though the signal IN, which is received at the input port 206 of the logic gate 202, is floating. Advantageously, the storage element 114 including the cross-coupled NOR gates 202 and 204 does not have any DC leakage in steady-state. Steady-state can be referred to a state of a circuit when the voltages at all the nodes and ports have settled.

Figure 4:
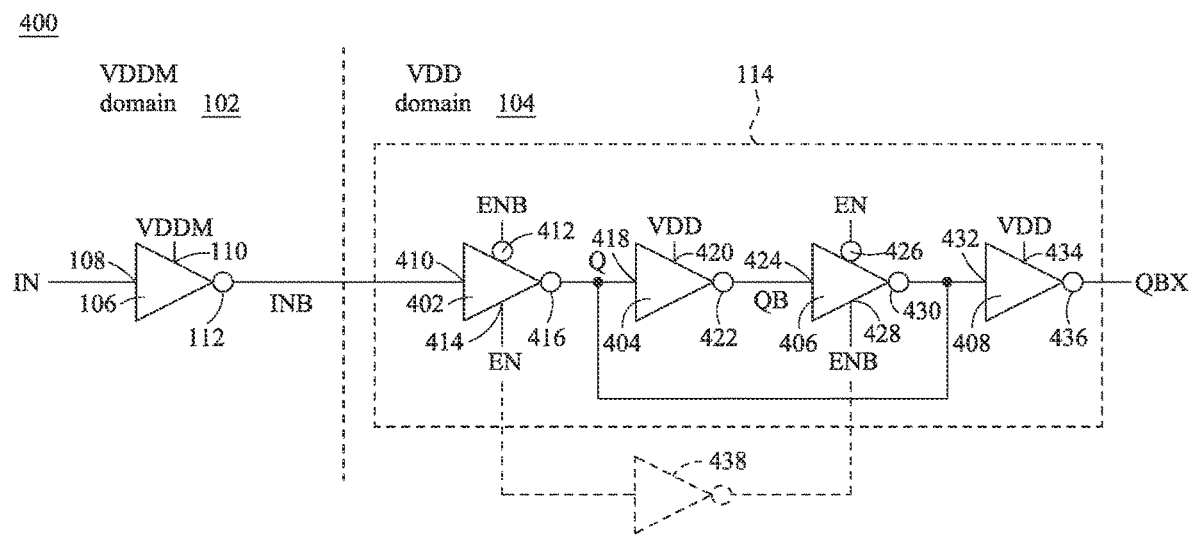
FIG. 4 illustrates a circuit diagram of yet another dual rail circuit, in accordance with some embodiments of the present disclosure.

FIG. 4 illustrates a circuit diagram of the dual rail circuit 400, in accordance with some embodiments of the present disclosure. The dual rail circuit 400 is an instance of the dual rail circuit 100 including an implementation of the storage element 114. The storage element 114 in FIG. 4 includes a logic gate 402, a logic gate 404 coupled to the logic gate 402, a logic gate 406 coupled to the logic gate 404, and a logic gate 408 coupled to the logic gate 406. In some embodiments, the logic gates 404 and 406 are cross-coupled.

In some embodiments, the logic gate 402 includes an input port 410, an enable-bar (ENB) port 412, an enable (EN) port 414, and an output port 416. In some embodiments, the input port 410 is coupled to the output port 112 of the logic gate 106. The input port 410 can receive the signal INB from the VDDM domain 102. In some embodiments, the output port 416 is coupled to the input port 418 of the logic gate 404.

In some embodiments, the logic gate 402 provides a high-impedance (high-Z) load at the output port 416 in response to the ENB port 412 receiving a signal having a magnitude of "VDD On" volts and the EN port 414 receiving a signal having a magnitude of 0V. Providing a high-Z load is understood as only having a high-Z path from the output port to any other port. For example, a high-Z load is provided by turning off any path in the logic gate from the output port to the ground port, any path in the logic gate from the output port to the VDD port, and, if applicable, any path in the logic gate from the output port to the input port. When the logic gate 402 provides the high-Z load, the signal Q can be independent of the signal INB. Advantageously, by isolating the signal Q from the signal INB, the logic gate 402 can prevent steady-state DC leakage in the logic gate 402 or in any logic gate coupled to the output of the logic gate 402.

In some embodiments, the logic gate 402 provides the signal Q at the output port 416 in response to the ENB port 412 receiving a signal having a magnitude of 0V and the EN port 414 receiving a signal having a magnitude of "VDD On" volts. In some embodiments, when the logic gate 402 provides the signal Q, the signal Q is inverted from the signal INB.

In some embodiments, the logic gate 402 is an enable-controlled logic gate. In some embodiments, the logic gate 402 is a tri-state buffer, an enable-controlled NOR gate, or an enable-controlled NAND gate. The tri-state buffer can be implemented as a complementary metal-oxide-semiconductor (CMOS) tri-state buffer. The tri-state buffer can include two NMOS transistors and two PMOS transistors coupled in series. The gate of one NMOS transistor can be coupled to the EN port 414, and the gate of one PMOS transistor can be coupled to the ENB port 412. The gates of the other NMOS transistor and the other PMOS transistor can be coupled to the input port 410. The drains of one NMOS transistor and one PMOS transistor can be coupled to the output port 416. The source of one PMOS transistor can be coupled the drain of the other PMOS transistor, and the source of the other PMOS transistor can be coupled to the ENB port 412. The source of one NMOS transistor can be coupled the drain of the other NMOS transistor, and the source of the other NMOS transistor can be coupled to the EN port 414.

In some embodiments, the logic gate 404 includes an input port 418, a VDD port 420, and an output port 422. In some embodiments, the input port 418 is coupled to the output port 416 of the logic gate 402. The input port 418 can receive the signal Q. In some embodiments, the output port 422 is coupled to the input port 424 of the logic gate 406. In some embodiments, the logic gate 404 is an inverter. The logic gate 404 may be implemented similar to the logic gate 106.

In some embodiments, the logic gate 406 includes an input port 424, an ENB port 426, an EN port 428, and an output port 430. In some embodiments, the input port 424 is coupled to the output port 422 of the logic gate 404. The input port 424 can receive the signal QB. In some embodiments, the output port 430 is coupled to the input port 432 of the logic gate 408.

In some embodiments, the logic gate 406 is an enable-controlled logic gate. In some embodiments, the logic gate 406 is a tri-state buffer, an enable-controlled NOR gate, or an enable controlled NAND gate. The logic gate 406 may be implemented similar to the logic gate 402.

In some embodiments, the logic gates 404 and 406 are cross-coupled. In some embodiments, the output port 430 is coupled to the input port 418 of the logic gate 404 and the output port 416 of the logic gate 402. Thus, the logic gate 406 can provide a stable signal Q while the logic gate 404 is providing a high-Z load. In some embodiments, at any given time, one of the logic gates 402 and 406 provide a high-Z load at the respective output port. Thus, the logic gates 402 and 406 may not simultaneously provide different signal Q voltages.

In some embodiments, the EN port 414 of the logic gate 402 receives a signal EN from a same circuit as the ENB port 426 of the logic gate 406. In some embodiments, the EN port 414 of the logic gate 402 and the ENB port 426 of the logic gate 406 receive the same signal EN. In some embodiments, the EN port 414 is coupled to the ENB port 426. In some embodiments, the ENB port 412 of the logic gate 402 receives a signal EN from a same circuit as the EN port 428 of the logic gate 406. In some embodiments, the ENB port 412 of the logic gate 402 and the EN port 428 of the logic gate 406 receive the same signal ENB. In some embodiments, the EN port 414 is coupled to the ENB port 426. In some embodiments, the ENB signal is inverted from the EN signal. In some embodiments, the EN port 414 is coupled to an input of an inverter 438 and the EN port 428 is coupled to an output of the inverter 438.

In some embodiments, the logic gate 408 includes an input port 432, a VDD port 434, and an output port 436. In some embodiments, the input port 432 is coupled to the output port 430 of the logic gate 406. The input port 432 can receive the signal Q (e.g., from either the logic gate 406 or the logic gate 402). In some embodiments, the output port 436 provides a signal QBX. In some embodiments, the signal QBX has a same magnitude as the signal QB. In some embodiments, the logic gate 408 is an inverter. The logic gate 408 may be implemented similar to the logic gate 106.

Figure 5:
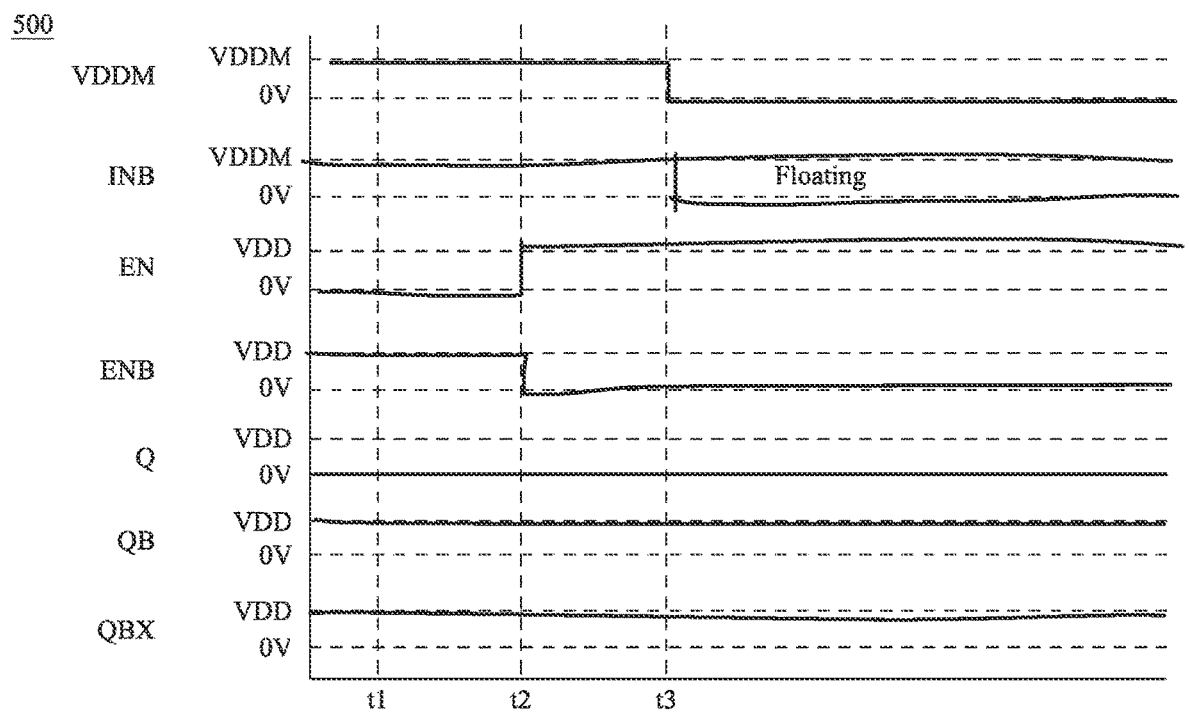
FIG. 5 illustrates a timing diagram for operation of the dual rail circuit of FIG. 4, in accordance with some embodiments of the present disclosure.

FIG. 5 illustrates a timing diagram for operation 500 of the dual rail circuit 400 of FIG. 4, in accordance with some embodiments of the present disclosure. The exemplary diagram illustrates operation of the dual rail circuit 400 in response to the rail signal VDDM going to 0V. At time t1, a magnitude of the rail signal VDDM at the VDDM port 110 is equal to the "VDDM On" voltage and a magnitude of the signal INB is equal to the "VDDM On" voltage. At time t1, a magnitude of the signal EN is equal to 0V and a magnitude of the signal ENB is equal to the "VDD On" voltage. In some embodiments, at time t1, the logic gate 402 is enabled and providing the signal Q and the logic gate 406 is disabled and providing a high-Z load. In some embodiments, at time t1, a magnitude of the signal Q is equal to 0V because the signal INB is inverted by the logic gate 402. In some embodiments, at time t1, a magnitude of the signal QB is equal to 0V because the signal Q is inverted by the logic gate 404. In some embodiments, at time t1, a magnitude of the signal QBX is equal to 0V because the signal Q is inverted by the logic gate 408.

At time t2, a magnitude of the signal EN goes to the "VDD On" voltage and a magnitude of the signal ENB goes to 0V. In some embodiments, at time t1, the logic gate 406 is enabled and providing the signal Q and the logic gate 402 is disabled and providing a high-Z load.

At time t3, a magnitude of the rail signal VDDM goes to 0V. At time t3, a magnitude of the signal INB becomes floating. In some embodiments, at time t3, a magnitude of the signal Q remains at 0V because the logic gate 406 is inverting the signal QB to provide the signal Q and the signal QB has not changed. In some embodiments, at time t3, a magnitude of the signal QB remains at 0V because the logic gate 404 is inverting the signal Q to provide the signal QB and the signal Q has not changed. In some embodiments, at time t3, a magnitude of the signal QBX remains at 0V because the logic gate 408 is inverting the signal Q to provide the signal QBX and the signal Q has not changed. In some embodiments, t2 occurs before t3. In some embodiments, t2 occurs after t3, in which case the signals Q, QB, and QBX can change in between t2 and t3, and change back to their initial states at t3.

Figure 6:
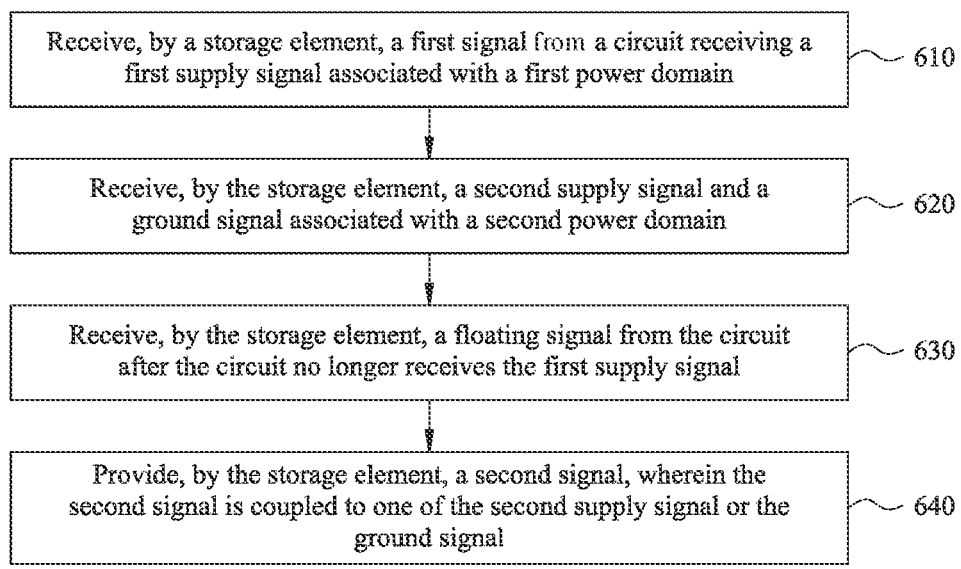
FIG. 6 illustrates a flowchart of a method to operate a storage element of a dual rail circuit, in accordance with some embodiments of the present disclosure.

FIG. 6 illustrates a flowchart of a method 600 to operate a storage element 114 in one of the dual rail circuits 100, 200, or 400, in accordance with some embodiments of the present disclosure. It is noted that the method 600 is merely an example and is not intended to limit the present disclosure. Accordingly, it is understood that additional operations may be provided before, during, and after the method 600 of FIG. 6, and that some other operations may only be briefly described herein. In some embodiments, the method 600 is performed by the storage element 114.

At operation 610, a storage element (e.g., the storage element 114) receives a first signal (e.g., the signal INB) from a circuit receiving a first supply signal (e.g., the rail signal VDDM) associated with a first power domain (e.g., the VDDM domain 102). At operation 620, the storage element receives a second supply signal (e.g., the rail signal VDD) and a ground signal (e.g., signal GND) associated with a second power domain (e.g., the VDD domain 104). In some embodiments, the storage element stores the first signal.

At operation 630, the storage element receives a floating signal (e.g., the signal INB) from the circuit. In some embodiments, the storage element receives the floating signal after the circuit no longer receives the first supply signal. At operation 640, the storage element provides a second signal (e.g., the signal Q). In some embodiments, the second signal is coupled to one of the second supply signal or the ground signal (e.g., the second signal is either a high signal or a low signal, and not a floating signal). In some embodiments, the storage element provides the second signal based on the first signal. In some embodiments, the storage element inverts the first signal to provide the second signal.

In some embodiments, the storage element receives an enable signal in a first state (e.g., the signal ENB in a high state and the signal EN in a low state) that causes the storage element to isolate the circuit in the first power domain from circuits in the second power domain. In some embodiments, the storage element receives the enable signal in the first state that causes a feedback loop in the storage element to be enabled. In some embodiments, the storage element receives the enable signal in a second state (e.g., the signal EN in a high state and the signal ENB in a low state) that causes coupling between the first power domain and the second power domain and causes the feedback loop to be disabled. In some embodiments, the storage element receives a third signal from the circuit (e.g., the signal IN). In some embodiments, the first signal is inverted from the third signal.

In some aspects of the present disclosure, a circuit in a first power domain is disclosed. In some aspects, the circuit in a first power domain includes a first enable-controlled logic gate coupled to a second circuit in a second power domain different from the first power domain. In some aspects, the circuit in a first power domain includes a feedback loop coupled to the first enable-controlled logic gate, the feedback loop including a first inverter and a second enable-controlled logic gate coupled to the first inverter. In some aspects, the circuit in a first power domain includes a second inverter coupled to the feedback loop.

In some embodiments, one of the first enable-controlled logic gate and the second enable-controlled logic gate is enabled and a second one of the first enable-controlled logic gate and the second enable-controlled logic gate is disabled. In some embodiments, the first enable-controlled logic gate includes a first enable port and a first enable-bar port. In some embodiments, the second enable-controlled logic gate includes a second enable port and a second enable-bar port. In some embodiments, the first enable port is coupled to the second enable port. In some embodiments, the first enable-bar port is coupled to the second enable port. In some embodiments, the first enable-controlled logic gate is a first tri-state buffer and the second enable-controlled logic gate is a second tri-state buffer.

In some embodiments, an output port of the first enable-controlled logic gate is coupled to an input port of the first inverter. In some embodiments, an output port of the first inverter is coupled to an input port of the second enable-controlled logic gate. In some embodiments, an output port of the second enable-controlled logic gate is coupled to an input port of the second inverter. In some embodiments, an output port of the second enable-controlled logic gate is coupled to an input of the first inverter.

In some aspects of the present disclosure, a dual rail circuit is disclosed. In some embodiments, the circuit includes a first circuit in a first power domain. In some embodiments, the first circuit includes an input port and an output port. In some embodiments, the dual rail circuit includes a second circuit in a second power domain different from the first power domain. In some embodiments, the second circuit is coupled to the input port of the first circuit and the output port of the first circuit. In some embodiments, the second circuit includes cross-coupled logic gates.

In some embodiments, the two cross-coupled logic gates include a first NOR gate and a second NOR gate cross-coupled with the first NOR gate. In some embodiments, an input port of the first circuit is coupled to the first NOR gate and an output port of the first circuit is coupled to the second NOR gate. In some embodiments, the first circuit includes a voltage supply port and wherein the voltage supply port is coupled to the input port. In some embodiments, the first circuit includes an inverter.

In some aspects, a method is disclosed. In some embodiments, the method includes receiving, by a storage element, a first signal from a circuit receiving a first supply signal associated with a first power domain. In some embodiments, the method includes receiving, by the storage element, a second supply signal and a ground signal associated with a second power domain. In some embodiments, the method includes receiving, by the storage element, a floating signal from the circuit after the circuit no longer receives the first supply signal. In some embodiments, the method includes providing, by the storage element, a second signal, wherein the second signal is coupled to one of the second supply signal or the ground signal.

In some embodiments, the method includes storing the first signal in the storage element. In some embodiments, the method includes providing the second signal based on the first signal. In some embodiments, the method includes inverting the first signal to provide the second signal.

In some embodiments, the method includes receiving an enable signal that causes the storage element to isolate the circuit in the first power domain from circuits in the second power domain. In some embodiments, the method includes receiving an enable signal that causes a feedback loop in the storage element to be enabled. In some embodiments, the method includes receiving a third signal from the circuit. In some embodiments, the first signal is inverted from the third signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit in a first power domain, the circuit comprising:
   a first enable-controlled logic gate coupled to a second circuit in a second power domain different from the first power domain, wherein an input port of the first enable-controlled logic gate is coupled to an output port of the second circuit;
   a feedback loop coupled to the first enable-controlled logic gate, the feedback loop comprising:
      a first inverter; and
      a second enable-controlled logic gate coupled to the first inverter; and
   a second inverter coupled to the feedback loop, wherein an output of the first inverter is coupled to an input of the second enable-controlled logic gate, wherein an output of the second enable-controlled logic gate is coupled to an input of the first inverter, wherein the first enable-controlled logic gate, the first inverter, the second enable-controlled logic gate, and the second inverter are coupled in series.

2. The circuit of claim 1, wherein one of the first enable-controlled logic gate and the second enable-controlled logic gate is enabled and a second one of the first enable-controlled logic gate and the second enable-controlled logic gate is disabled.

3. The circuit of claim 2, wherein the first enable-controlled logic gate includes a first enable port and a first enable-bar port, wherein the second enable-controlled logic gate includes a second enable port and a second enable-bar port, wherein the first enable port is coupled to the second enable port, and wherein the first enable-bar port is coupled to the second enable port.

4. The circuit of claim 1, wherein an output port of the first enable-controlled logic gate is coupled to an input port of the first inverter.

5. The circuit of claim 1, wherein an output port of the first inverter is coupled to an input port of the second enable-controlled logic gate.

6. The circuit of claim 1, wherein an output port of the second enable-controlled logic gate is coupled to an input port of the second inverter.

7. The circuit of claim 1, wherein an output port of the second enable-controlled logic gate is coupled to an input of the first inverter.

8. The circuit of claim 1, wherein the first enable-controlled logic gate is a first tri-state buffer and the second enable-controlled logic gate is a second tri-state buffer.

9. A method comprising:
   receiving, by a storage element, a first signal from a circuit receiving a first supply signal associated with a first power domain;
   receiving, by the storage element, a second supply signal and a ground signal associated with a second power domain;
   receiving, by the storage element, a floating signal from the circuit after the circuit no longer receives the first supply signal;
   providing, by the storage element, a second signal, wherein the second signal is coupled to one of the second supply signal or the ground signal; and
   receiving, by the storage element, an enable signal that causes the storage element to isolate the circuit in the first power domain from circuits in the second power domain, wherein the storage element comprises a first enable-controlled logic gate, a first inverter, a second enable-controlled logic gate, and a second inverter coupled in series, wherein an output of the first inverter is coupled to an input of the second enable-controlled logic gate, wherein an output of the second enable-controlled logic gate is coupled to an input of the first inverter.

10. The method of claim 9, further comprising storing the first signal in the storage element.

11. The method of claim 10, further comprising providing the second signal based on the first signal.

12. The method of claim 11, further comprising inverting the first signal to provide the second signal.

13. The method of claim 9, further comprising receiving an enable signal that causes a feedback loop in the storage element to be enabled.

14. The method of claim 9, further comprising receiving a third signal from the circuit, wherein the first signal is inverted from the third signal.

15. A circuit in a first power domain, the circuit comprising:
   a first enable-controlled logic gate coupled to a second circuit in a second power domain different from the first power domain, wherein an input port of the first enable-controlled logic gate is coupled to an output port of the second circuit;

a feedback loop coupled to the first enable-controlled logic gate, the feedback loop comprising:
   a first inverter; and
   a second enable-controlled logic gate coupled to the first inverter; and a second inverter coupled to the feedback loop, wherein an output of the first inverter is coupled to an input of the second enable-controlled logic gate, wherein an output of the second enable-controlled logic gate is coupled to an input of the first inverter;

wherein the first enable-controlled logic gate and the second enable-controlled logic gate are alternately enabled, wherein the first enable-controlled logic gate, the first inverter, the second enable-controlled logic gate, and the second inverter are coupled in series.

16. The circuit of claim 15, wherein the first enable-controlled logic gate is a first tri-state buffer and the second enable-controlled logic gate is a second tri-state buffer.

17. The circuit of claim 15, wherein an output port of the first enable-controlled logic gate is coupled to an input port of the first inverter, and an output port of the first inverter is coupled to an input port of the second enable-controlled logic gate.

18. The circuit of claim 15, wherein an output port of the second enable-controlled logic gate is coupled to an input port of the second inverter, and an output port of the second enable-controlled logic gate is coupled to an input of the first inverter.

* * * * *